(12) United States Patent
Tanahashi et al.

(10) Patent No.: US 11,275,105 B2
(45) Date of Patent: Mar. 15, 2022

(54) RELIABILITY TEST DEVICE FOR COIL

(71) Applicant: TAIYO YUDEN CO., LTD., Tokyo (JP)

(72) Inventors: Yasunori Tanahashi, Tokyo (JP); Hiroyoshi Kobayashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 350 days.

(21) Appl. No.: 16/593,375

(22) Filed: Oct. 4, 2019

(65) Prior Publication Data

US 2020/0124657 A1    Apr. 23, 2020

(30) Foreign Application Priority Data

Oct. 19, 2018  (JP) .............................. JP2018-197506

(51) Int. Cl.
| | |
|---|---|
| *G01R 31/12* | (2020.01) |
| *H02M 3/156* | (2006.01) |
| *H03K 17/06* | (2006.01) |
| *H03K 17/082* | (2006.01) |
| *H01F 41/00* | (2006.01) |
| *G01R 31/72* | (2020.01) |

(52) U.S. Cl.
CPC ............ *G01R 31/12* (2013.01); *G01R 31/72* (2020.01); *H01F 41/00* (2013.01); *H02M 3/156* (2013.01); *H03K 17/063* (2013.01); *H03K 17/0822* (2013.01)

(58) Field of Classification Search
CPC ...... G01R 31/12; G01R 31/72; G01R 31/003; G01R 27/02; G01R 27/2611; H01F 41/00; H02M 3/156; H02M 3/155; H03K 17/063; H03K 17/0822
USPC .................................. 324/762.01, 546, 654
See application file for complete search history.

(56) References Cited

U.S. PATENT DOCUMENTS

| | | | | |
|---|---|---|---|---|
| 6,147,498 A | * | 11/2000 | Sumiya ..................... | H01F 7/18 324/415 |
| 2009/0108849 A1 | * | 4/2009 | Berg ........................ | G01R 31/72 324/546 |
| 2020/0144825 A1 | * | 5/2020 | Kosugi ................... | H02M 1/08 |

FOREIGN PATENT DOCUMENTS

| | | |
|---|---|---|
| JP | 2012-058221 A | 3/2012 |
| JP | 2017-211280 A | 11/2017 |

* cited by examiner

*Primary Examiner* — Tung X Nguyen
*Assistant Examiner* — Robert P Alejnikov, Jr.
(74) *Attorney, Agent, or Firm* — Pillsbury Winthrop Shaw Pittman, LLP (57) ABSTRACT

A test device according to an embodiment of the present invention includes: a first measurement terminal connected to one end of a first coil to be tested; a second measurement terminal connected to another end of the first coil; a direct-current power source connected to the first measurement terminal; a first semiconductor switch connected between the second measurement terminal and a ground; and a drive unit for turning on and off the first semiconductor switch.

20 Claims, 6 Drawing Sheets

RELIABILITY TEST DEVICE FOR COIL

CROSS-REFERENCE TO RELATED APPLICATIONS

This application is based on and claims the benefit of priority from Japanese Patent Application Serial No. 2018-197506 (filed on Oct. 19, 2018), the contents of which are hereby incorporated by reference in their entirety.

TECHNICAL FIELD

The present invention relates to a reliability test device for coils.

BACKGROUND

Since there are various failure modes of coils, it is necessary to use a test device in accordance with a failure mode to diagnose whether a coil is normal or abnormal. The failure modes of coils are divided into a current failure mode and an insulation failure mode. The current failure mode is caused by heat generated when an electric current is applied, and in the insulation failure mode, application of voltage causes dielectric breakdown. The insulation failure mode is further divided into an overvoltage failure mode and a life failure mode. In the overvoltage failure mode, application of an overvoltage largely exceeding a rated voltage to a coil causes dielectric breakdown, and in the life failure mode, repeated application of a voltage near the rated voltage causes dielectric breakdown.

For the current failure mode, diagnosis of whether there is an abnormality can be conducted by applying to a subject coil an electric current from a direct-current power source in accordance with diagnosis conditions and then measuring characteristic values of the coil such as L (inductance), Q (quality factor), R (resistance), and Z (impedance).

For the overvoltage failure mode, diagnosis of whether there is an abnormality can be conducted by applying to a subject coil an impulse voltage largely exceeding the rated voltage of the coil and evaluating damped oscillatory voltage generated across the coil. A test device for such diagnosis is disclosed in Japanese Patent Application Publication No. 2012-058221 and Japanese Patent Application Publication No. 2017-211280.

A reliability test device for diagnosing an abnormality in the life failure mode needs to repeatedly apply a voltage in accordance with the diagnosis conditions while preventing abnormality of the subject coil in other modes. Accordingly, in a reliability test device for coils, it is preferable that duration of application of the electric current to the subject coil is kept short to prevent abnormality in the current failure mode, and it is also preferable that an unnecessarily large voltage is not applied to the subject coil to prevent abnormality in the overvoltage failure mode. However, no reliability test devices for coils have ever satisfied such demands.

Metal magnetic materials less prone to magnetic saturation have recently been used as magnetic materials for coils carrying a large electric current. Since a magnetic mold formed of a metal magnetic material is prone to a fault or a failure in the insulation failure mode, there is a high necessity of diagnosing whether there is abnormality not only in the overvoltage failure mode but also the life failure mode.

SUMMARY

An object of the present invention is to solve or relieve at least a part of the above problem. More specifically, an object of the present invention is to provide a reliability test device for diagnosing whether there is abnormality of a coil in the life failure mode. Other objects of the present invention will be made apparent through description in the entire specification.

A test device according to an embodiment of the present invention comprises: a first measurement terminal connected to one end of a first coil to be tested; a second measurement terminal connected to another end of the first coil; a direct-current power source connected to the first measurement terminal; a first semiconductor switch connected between the second measurement terminal and a ground; and a drive unit for turning on and off the first semiconductor switch.

In an embodiment of the present invention, the first semiconductor switch is an FET switch with a gate connected to the drive unit, a drain connected to the second measurement terminal, and a source connected to the ground.

In an embodiment of the present invention, the test device further comprises a voltage limiting element for limiting a counter electromotive force to a first voltage, the counter electromotive force being applied to the first coil when the first semiconductor switch is turned off.

In an embodiment of the present invention, the voltage limiting element is a voltage regulator diode.

In an embodiment of the present invention, a second coil is connected between the first measurement terminal and the second measurement terminal in series with the first coil.

In an embodiment of the present invention, a second coil is connected between the first measurement terminal and the second measurement terminal in parallel with the first coil.

In an embodiment of the present invention, one end of the second coil is connected to the first measurement terminal, and another end of the second coil is connected to a third measurement terminal, and the test device further comprises a second semiconductor switch connected between the third measurement terminal and the ground.

In an embodiment of the present invention, the test device further comprises a capacitor connected between the second measurement terminal and the ground.

In an embodiment of the present invention, the test device further comprises a measuring unit for measuring a characteristic value of the first coil.

ADVANTAGES

The test device disclosed herein makes it possible to diagnose abnormality of a coil in the life failure mode.

DESCRIPTION OF THE EMBODIMENTS

Various embodiments of the invention will be described hereinafter with reference to the drawings. Elements common to a plurality of drawings are denoted by the same reference signs throughout the plurality of drawings.

Figure 1:
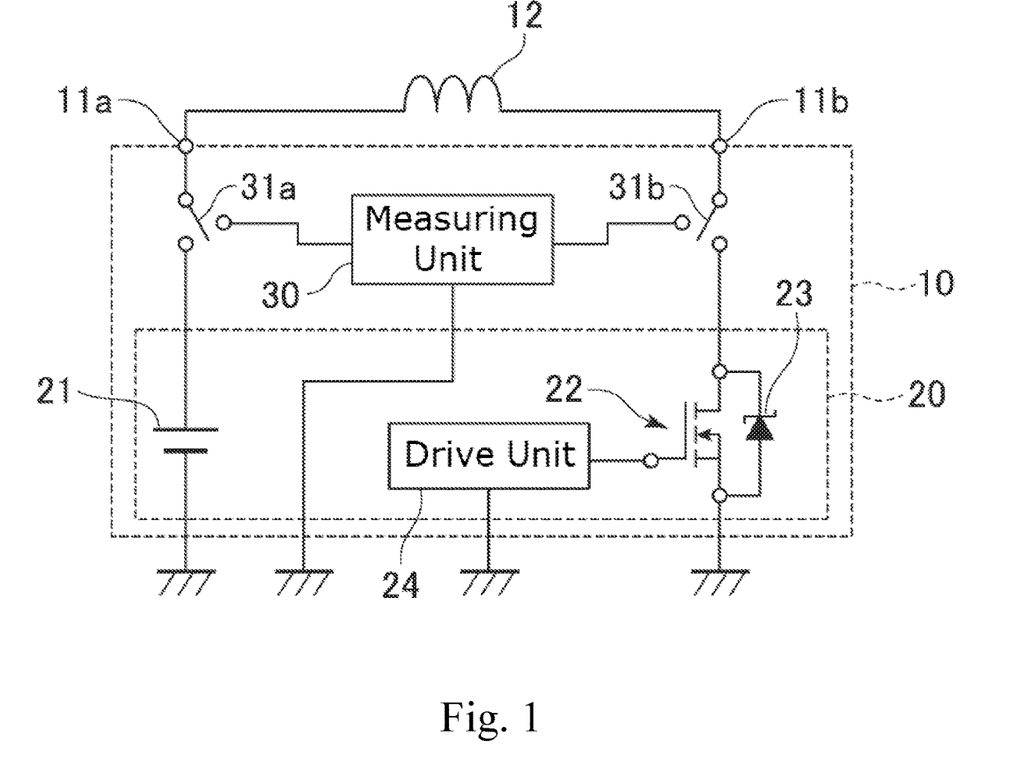
FIG. 1 is a block diagram schematically illustrating functionality of a test device according to an embodiment of the present invention.
Figure 2:
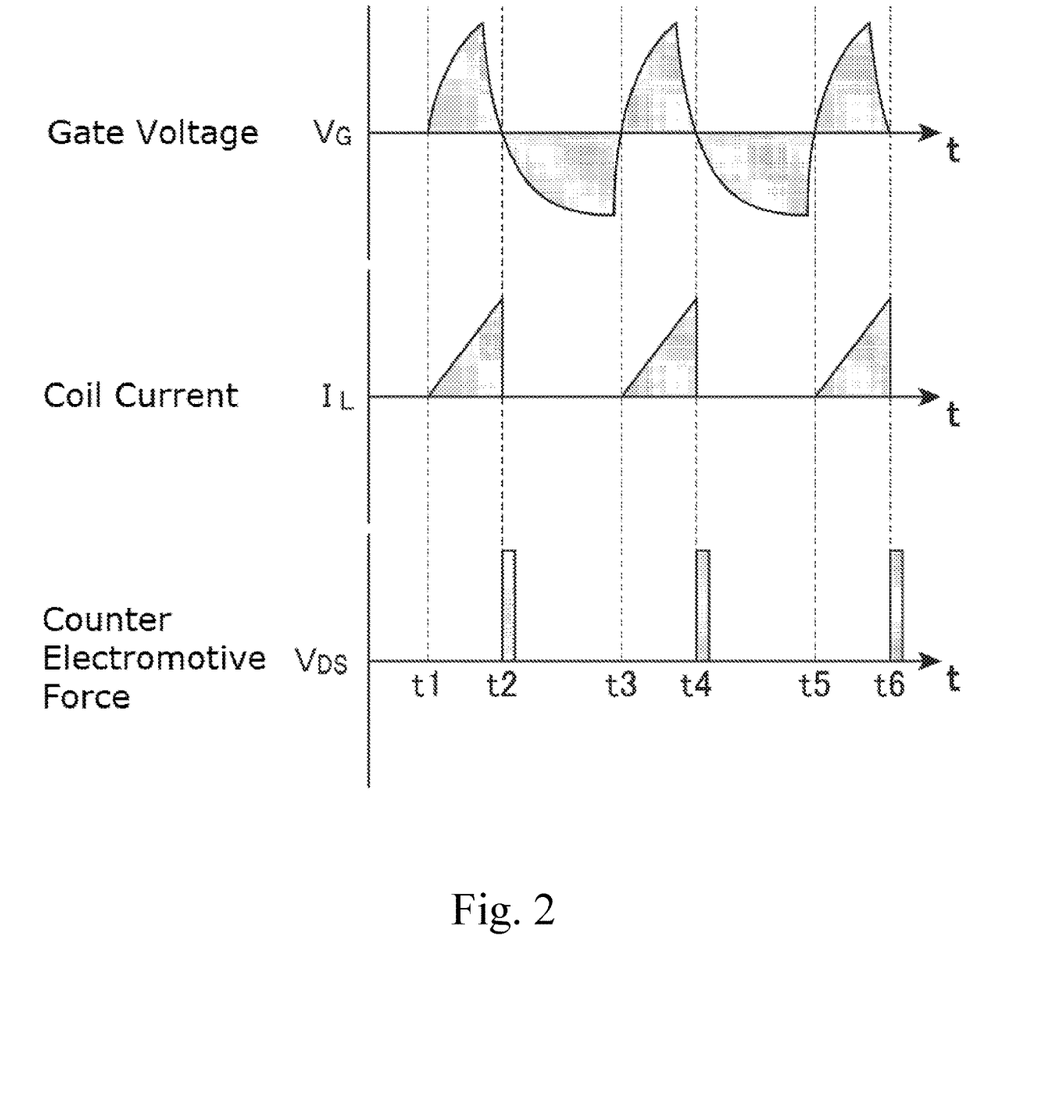
FIG. 2 is a graph schematically illustrating a counter electromotive force generated in the test device of FIG. 1.

First, a test device 10 according to an embodiment of the invention will be hereinafter described with reference to FIGS. 1 and 2. FIG. 1 is a block diagram schematically illustrating functionality of the test device 10 according to an embodiment of the present invention, and FIG. 2 is a graph schematically illustrating a counter electromotive force generated in the test device 10.

As shown, the test device 10 includes a voltage applying unit 20 and a measuring unit 30. The voltage applying unit 20 applies a voltage to a subject coil 12, and the measuring unit 30 conducts measurement for diagnosing a failure of the coil 12. The subject coil 12 is connected to the test device 10 via a measurement terminal 11a and a measurement terminal 11b. One end of the coil 12 is connected to the measurement terminal 11a, and the other end thereof is connected to the measurement terminal 11b. The coil 12 is connected to the measurement terminal 11a and the measurement terminal 11b either directly or indirectly via probes (not shown). The measuring unit 30 is connected to the voltage applying unit 20 in parallel with the coil 12 via a switch 31a and a switch 31b. Thus, the inductor 12 is selectively connected to the voltage applying unit 20 or the measuring unit 30. More specifically, the inductor 12 is electrically connected to only one of the voltage applying unit 20 and the measuring unit 30 in accordance with switching of the switch 31a and the switch 31b.

The voltage applying unit 20 includes a direct-current power source 21, a MOSFET 22, a voltage regulator diode 23, and a drive unit 24. The voltage applying unit 20 operates while the measuring unit 30 is disconnected from the coil 12 by the switch 31a and the switch 31b. With these components and other circuit elements as necessary, the voltage applying unit 20 repeatedly applies a predetermined voltage to the coil 12, thereby applying the same voltage stress as applied to a coil in an actual circuit (for example, a switching circuit of a DC-DC converter) used for a long period.

The direct-current power source 21 is connected between the measurement terminal 11a and a ground and configured to apply a direct current $V_D$ to the subject coil 12.

The MOSFET 22 is a MOS field-effect transistor that is turned on and off in accordance with the voltage applied to the gate thereof from the drive unit 24. The MOSFET 22 is connected between the measurement terminal 11b and the ground. More specifically, the gate, drain, and source of the MOSFET 22 are connected to the drive unit 24, the measurement terminal 11b, and the ground, respectively. In FIG. 1, the MOSFET 22 is shown as an N-channel MOSFET, but it may also be a P-channel MOSFET.

The MOSFET 22 is an example of a semiconductor switch that is turned on and off with a voltage applied from the drive unit 24. Semiconductor switches other than the MOSFET 22 may be applied to the present invention. Various FETs other than the MOSFET may be used as the semiconductor switch of the present invention. The semiconductor switch of the present invention may be formed of an insulated gate bipolar transistor (IGBT), a bipolar transistor (Bip-Tr), a junction field-effect transistor (J-FET), and other various semiconductor switches, as well as the MOSFET.

The drive unit 24 supplies a drive signal to the MOSFET 22 based on a binary control signal Sc. The control signal Sc has two values signified by, for example, a high level and a low level. The drive signal is supplied from the drive unit 24 to the MOSFET 22 when the control signal Sc is at the low level, but not when it is at the high level. When the drive signal input from the drive unit 24 causes the gate voltage $V_G$ of the MOSFET 22 to exceed a threshold voltage, an electric current flows between the drain and the source of the MOSFET 22. The MOSFET 22 preferably has a rated drain current value larger than the electric current flowing between the drain and the source. The drive unit 24 may drive the MOSFET 22 in a way other than those explicitly described herein.

The voltage regulator diode 23 has a predetermined yield voltage $V_A$. The voltage regulator diode 23 is connected between the source and the drain of the MOSFET 22. The anode of the voltage regulator diode 23 is connected to the drain of the MOSFET 22, and the cathode thereof is connected to the source of the MOSFET 22. Thus, the voltage regulator diode 23 can limit the voltage between the source and the drain to the yield voltage $V_A$ thereof, so as to protect the MOSFET 22 from the counter electromotive force generated when the MOSFET 22 is turned off. Further, the voltage regulator diode 23 can limit the counter electromotive force applied to the coil 12 when the MOSFET 22 is turned off to the difference between the yield voltage $V_A$ and the voltage $V_D$ of the direct-current power source, expressed as $V_A - V_D$. When the withstanding voltage of the MOSFET 22 is larger than the counter electromotive force, the voltage regulator diode 23 may be omitted. The voltage regulator diode 23 is an example of a voltage limiting element for limiting the surge voltage applied to the coil 12 by the counter electromotive force generated when the MOSFET 22 serving as a semiconductor switch is turned off. The voltage regulator diode 23 is a diode having a predetermined yield voltage $V_A$. Yield voltages include those determined by Zener breakdown and those determined by Avalanche breakdown. A voltage regulator diode having an yield voltage determined by Zener breakdown may be referred to as a Zener diode. A voltage regulator diode having an yield voltage determined by Avalanche breakdown may be referred to as an Avalanche diode. The Zener diode (in a narrow sense) and the Avalanche diode may be collectively referred to as Zener diodes (in a wide sense). Since the yield voltage determined by Avalanche breakdown can be made larger than the yield voltage determined by Zener breakdown, an Avalanche diode is preferably used as the voltage regulator diode 23 for tests requiring high voltages.

The counter electromotive force generated when the MOSFET 22 is turned off is inversely proportional to the output capacitance Coss of the MOSFET 22. Therefore, the MOSFET 22 should preferably have a low output capacitance Coss such that a counter electromotive force having a magnitude required for the test can be generated with a small electric current.

The measuring unit 30 is configured to conduct measurement for diagnosing whether there is abnormality in the coil 12. The measuring unit 30 can display measurement values on a display (not shown) of the test device 10 or a display of an external device. The measuring unit 30 may include the display for displaying the measurement values.

In an embodiment, the measuring unit 30 is configured to measure characteristic values of the coil 12. The characteristic values of the coil 12 that can be measured by the measuring unit 30 include L, Q R, Z, and IR. The measuring unit 30 may be configured to measure one or more of L, Q R, Z, and IR of the coil 12. The characteristic values of the coil 12 may be measured by, for example, an LQR meter, an impedance analyzer, an insulation resistance tester, and other various measurement devices. In other words, the measuring unit 30 may be formed of an LQR meter, an impedance analyzer, an insulation resistance tester, and other various measurement devices. The measuring unit 30 can display, on a display, an inductance value, an electrical resistance value, and/or other measurement values related to the coil 12 and used for failure diagnosis of the coil 12. A tester who performs a test can determine whether there is abnormality in the coil 12 based on the measurement values of the measuring unit 30 displayed on the display.

The measuring unit 30 may include a storage section, a determination section, a display section, a communication section, and a control section. These components of the measuring unit 30 are electrically connected to each other via a bus, for example. The storage section stores the measurement values obtained from the measuring unit 30, a determination result of whether there is abnormality in the coil 12, a threshold value used for the determination, and other various information necessary for control of the test device 10. The storage section may store a control program. The determination section compares a threshold value stored on the storage section with the measurement values of the measuring unit 30, thereby to determine whether there is abnormality in the coil 12. The display section may be configured to display the measurement values of the measuring unit 30, the determination result made by the determination section, and other various information. The communication section may be configured to send to an external device the measurement values of the measuring unit 30, the determination result made by the determination section, and other various information, and receive necessary information from the external device. The control section is configured to control the storage section, the determination section, the display section, the communication section, and other functional components. The control section is an arithmetic device that loads a control program stored on the storage section into a memory and executes commands included in the loaded program.

The measuring unit 30 may be either installed in one device together with the voltage applying unit 20 or installed in a different device than the voltage applying unit 20. When the measuring unit 30 is installed in one device together with the voltage applying unit 20, the measuring unit 30 is connected to the voltage applying unit 20 in parallel with the coil 12 via the switch 31a and the switch 31b. While the voltage applying unit 20 applies a voltage to the coil 12, the switch 31a and the switch 31b are switched to connect the voltage applying unit 20 to the coil 12 and electrically disconnect the measuring unit 30 from the coil 12 and the voltage applying unit 20. After application of voltage stress necessary for the test is completed (for example, after the MOSFET 22 is turned on and off for a predetermined number of times), the switch 31a and the switch 31b are switched to connect the measuring unit 30 to the coil 12 and electrically disconnect the voltage applying unit 20 from the coil 12 and the measuring unit 30. After the switching, the measuring unit 30 conducts measurement on the coil 12. When the measuring unit 30 is installed in a different device than the voltage applying unit 20, the coil 12 having received the necessary voltage applied thereto by the voltage applying unit 20 is disconnected from the voltage applying unit 20, and the coil 12 is set between measurement terminals of the device having the measuring unit 30 installed therein. The measuring unit 30 then conducts measurement.

Next, a description is given of an operation of the test device 10 with reference to FIG. 2. The circuit of the test device 10 includes a parasitic capacitance and a parasitic resistance of the coil 12 and other parasitic components (a parasitic capacitance, a parasitic inductance, and a parasitic resistance). However, these parasitic components are sufficiently small and thus will be ignored in the description of the operation of the test device 10 as long as they substantially do not affect the operation of the test device 10.

In a test with the test device 10, the voltage applying unit 20 applies to the subject coil 12 a voltage according to the test conditions for a number of times according to the test conditions, thereby to apply to the coil 12 substantially the same voltage stress as in the actual use environment, and then the measuring unit 30 measures the characteristic values of the coil having received the voltage stress. A description will be hereinafter sequentially given of the operation of the voltage applying unit 20 repeatedly applying a voltage to the coil 12 and the operation of the measuring unit 30 measuring the characteristic values of the coil 12.

To conduct the test, the subject coil 12 is first connected to the measurement terminal 11a and the measurement terminal 11b. The switch 31a and the switch 31b are switched off to electrically disconnect the measuring unit 30 from the voltage applying unit 20.

Next, a low-level control signal Sc is applied to the drive unit 24 of the voltage applying unit 20. The drive unit 24 supplies a drive signal to the MOSFET 22 in accordance with the control signal Sc. The drive signal causes the gate voltage $V_G$ to reach a threshold voltage at time t1, and thus the MOSFET 22 is turned on. More specifically, the gate voltage $V_G$ reaches a threshold voltage at time t1, and an electric current flows between the drain and the source of the MOSFET 22. Thus, a coil current IL flows through the coil 12 that is connected to the direct-current power source 21 in series with the MOSFET 22. Since the coil current IL increases with the increase of the gate voltage $V_G$, the waveform of the coil current IL is triangular, as shown.

Next, when the control signal Sc is switched from the low level to the high level, the drive unit 24 no longer supplies the drive signal to the MOSFET 22. As a result, the gate voltage $V_G$ falls below the threshold voltage at time t2, and thus the MOSFET 22 is turned off. When the MOSFET 22 is turned off, the coil current IL flowing between the drain and the source and through the coil 12 is immediately shut off. Therefore, a counter electromotive force $V_{DS}$ is generated in the circuit of the test device 10, and surge voltages caused by the counter electromotive force $V_{DS}$ are applied between the drain and the source of the MOSFET 22 and across the coil 12. When the counter electromotive force is larger than the yield voltage $V_A$ of the voltage regulator diode 23, the surge voltage applied between the drain and the source of the MOSFET 22 has the same magnitude as the yield voltage $V_A$, and the surge voltage applied across the coil 12 has the magnitude of $V_A-V_D$, the difference between the yield voltage $V_A$ and the voltage $V_D$ of the direct-current power source. When the voltage applying unit 20 does not include the voltage regulator diode 23, the counter electromotive force $V_{DS}$ is applied as the surge voltage between the drain and the source of the MOSFET 22, and a voltage ($V_{DS}-V_D$) corresponding to the difference between the counter electromotive force $V_{DS}$ and the voltage $V_D$ of the direct-current power source is applied as the surge voltage across the coil 12. The yield voltage $V_A$ of the voltage regulator diode 23 can be appropriately set in accordance with the test conditions. For example, in testing a long-term reliability of a coil used in a circuit in which a constant voltage V1 is repeatedly applied, the yield voltage $V_A$ of the voltage regulator diode 23 may be set to $V1+V_D$ such that the voltage V1 is applied across the coil 12 when the MOSFET 22 is turned off.

Next, when the control signal Sc is switched from the high level to the low level, the drive unit 24 resumes supplying the drive signal to the MOSFET 22. As a result, the gate voltage $V_G$ reaches the threshold voltage again at time t3, and the MOSFET 22 is turned on and the coil current IL flows between the drain and the source of the MOSFET 22. Next, when the control signal Sc is switched from the low level to the high level, the coil current IL is immediately shut off, as in the previous cycle, and when the MOSFET 22 is turned off at time t4, a counter electromotive force is generated in the circuit of the voltage applying unit 20.

In the same way, the MOSFET 22 can be thereafter turned on and off based on the control signal Sc, such that the surge voltage can be applied to the coil 12 based on the counter electromotive force $V_{DS}$ generated when the MOSFET 22 is turned off. The MOSFET 22 is turned on and off for the number of times according to the test conditions. For example, to test the reliability of the coil 12 retained after the MOSFET is turned on and off 100,000 times, the MOSFET is turned on and off 100,000 times to apply the surge voltage to the coil 100,000 times. Since the MOSFET 22 or other semiconductor switches can be turned on and off at a high speed, it is possible to apply the voltage stress to the coil 12 at the same frequency (for example, several MHz to several tens MHz) as in the actual circuit in which the coil 12 is used (for example, a switching circuit of a DC-DC converter). The MOSFET 22 or other semiconductor switches can be turned on and off at a higher frequency than in the actual circuit in which the coil 12 is used, thereby to conduct the voltage stress test at a higher speed.

Next, the switch 31a and the switch 31b are switched on to electrically connect the coil 12 to the measuring unit 30. The measuring unit 30 measures the inductance, the resistance, or other characteristic values of the coil 12 in accordance with the purpose of the test. The measurement values obtained by the measuring unit 30 may be displayed on a display, for example. The tester can determine whether the coil 12 is normal or abnormal based on the measurement values displayed on the display. An arithmetic device included in the test device 10 or other devices may determine whether the coil 12 is normal or abnormal in accordance with a predetermined algorithm. In an embodiment, the measurement values of the measuring unit 30 may be compared with predetermined reference values to determine whether there is abnormality in the coil 12. In another embodiment, a measurement profile showing a time variation of the measurement values of the measuring unit 30 may be compared with a reference profile stored previously to determine whether there is abnormality in the coil 12.

As described above, the voltage applying unit 20 applies the voltage stress presumed in a circuit in which the coil 12 is actually used, and the measuring unit 30 measures the characteristic values of the coil 12 having received the voltage stress applied thereto, thereby to diagnose whether there is abnormality in the coil 12 based on the measurement values of the measuring unit. Thus, the long-term reliability of the coil 12 is tested.

Figure 3:
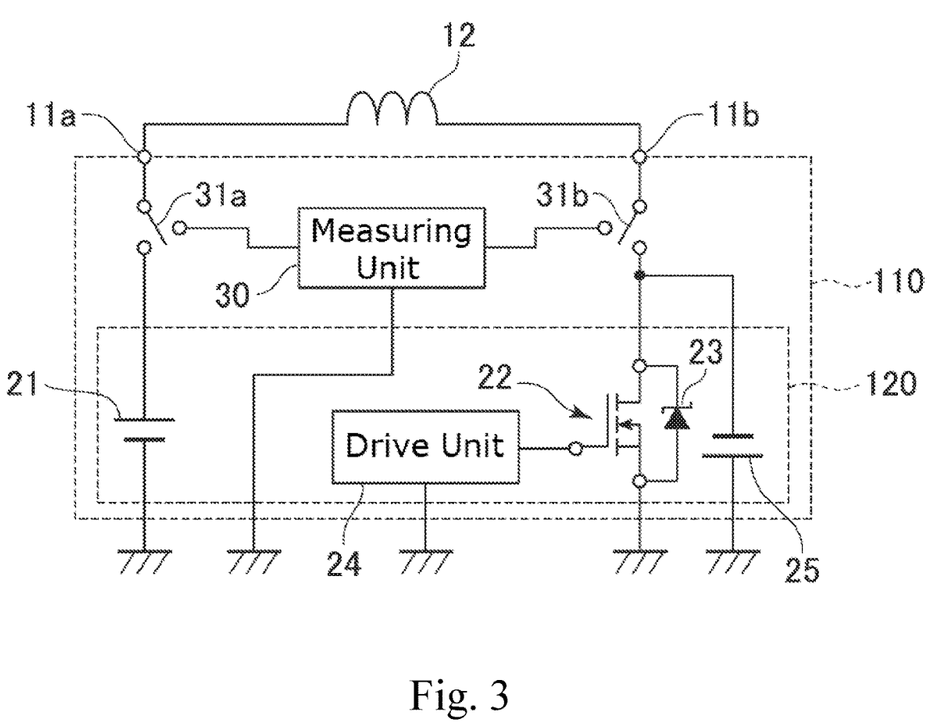
FIG. 3 is a block diagram schematically illustrating functionality of a test device according to another embodiment of the present invention.

Next, a test device 110 according to another embodiment of the present invention will be described with reference to FIG. 3. FIG. 3 is a block diagram schematically illustrating the test device 110 according to the other embodiment of the present invention. In the test device 110 shown in FIG. 3, the components that are the same as or similar to those of the test device 10 shown in FIG. 1 are denoted by reference signs similar to those in FIG. 1, and detailed descriptions thereof are omitted.

Figure 4:
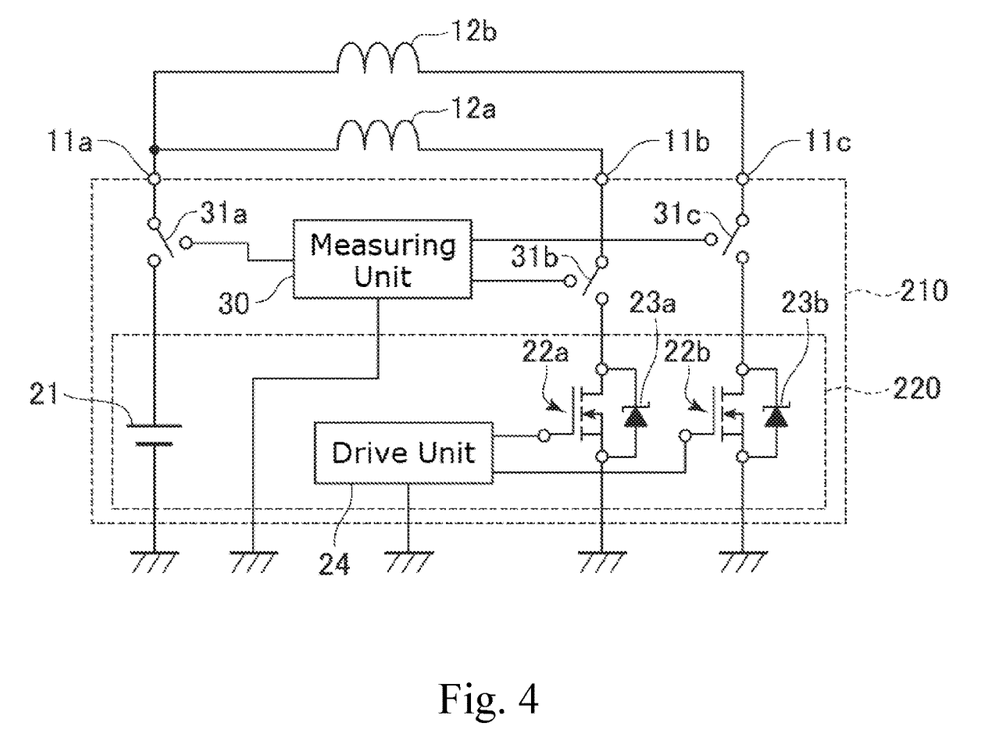
FIG. 4 is a block diagram schematically illustrating functionality of a test device according to another embodiment of the present invention.

The test device 110 shown in FIG. 3 is different from the test device 10 in that it includes a voltage applying unit 120 in place of the voltage applying unit 20, and the voltage applying unit 120 includes a direct-current power source 25 installed between the drain of the MOSFET 22 and the ground and connected in parallel with the MOSFET 22. The direct-current power source 25 applies a direct current to the coil 12, in addition to the coil current IL. Thus, the current stress applied to the coil 12 can be more similar to that in an actual circuit in which the coil 12 is used. Next, a test device 210 according to another embodiment of the present invention will be described with reference to FIG. 4. FIG. 4 is a block diagram schematically illustrating the test device 210 according to the other embodiment of the present invention. In the test device 210 shown in FIG. 4, the components that are the same as or similar to those of the test device 10 shown in FIG. 1 are denoted by reference signs similar to those in FIG. 1, and detailed descriptions thereof are omitted.

The test device 210 shown in FIG. 4 is different from the test device 10 in that it is configured such that the surge voltage generated when the MOSFET is turned off is simultaneously applied to a plurality of coils. More specifically, the test device 210 is connected to two coils, a coil 12a and a coil 12b. One end of the coil 12a is connected to the measurement terminal 11a, and the other end thereof is connected to the measurement terminal 11b. One end of the coil 12b is connected to the measurement terminal 11a, and the other end thereof is connected to a measurement terminal 11c.

In the voltage applying unit 220 included in the test device 210, a MOSFET 22a is installed between the measurement terminal 11b and the ground, and a MOSFET 22b is installed between the measurement terminal 11c and the ground. The MOSFET 22a and the MOSFET 22b are configured in the same manner as the MOSFET 22. In the embodiment shown, the drive signals to the MOSFET 22a and the MOSFET 22b are supplied from the single drive unit 24. Thus, the MOSFET 22a and the MOSFET 22b operate in a synchronized manner. In another embodiment, the drive signal input to the MOSFET 22b may be supplied from a drive unit (not shown) different from the drive unit 24 that supplies the drive signal to the MOSFET 22a.

In the voltage applying unit 120, a voltage regulator diode 23a is installed in parallel with the MOSFET 22a, and a voltage regulator diode 23b is installed in parallel with the MOSFET 22b. The voltage regulator diode 23a and the voltage regulator diode 23b are configured in the same manner as the voltage regulator diode 23.

When the MOSFET 22a is switched from on to off, a counter electromotive force inversely proportional to the output capacitance of the MOSFET 22a is generated between the drain of the MOSFET 22a and the ground. The coil 12a receives a surge voltage caused by the counter electromotive force. Likewise, when the MOSFET 22b is switched from on to off, a counter electromotive force inversely proportional to the output capacitance of the MOSFET 22b is generated between the drain of the MOSFET 22b and the ground. The coil 12b receives a surge voltage caused by the counter electromotive force.

The measuring unit 30 is connected to the voltage applying unit 220 in parallel with the coil 12a and the coil 12b via the switch 31a, the switch 31b, and a switch 31c. The voltage applying unit 220 operates while the switch 31a, the switch 31b, and the switch 31c are off.

The test device 210 may be connected to three or more subject coils. The test device 210 may include MOSFETs in a number corresponding to the number of the subject coils.

The test device 210 can apply a surge voltage to a plurality of coils (two coils in the example shown, the coil 12a and the coil 12b) in parallel. The test device 210 improves the efficiency of the reliability test by applying a surge voltage to a plurality of coils in parallel.

Figure 5:
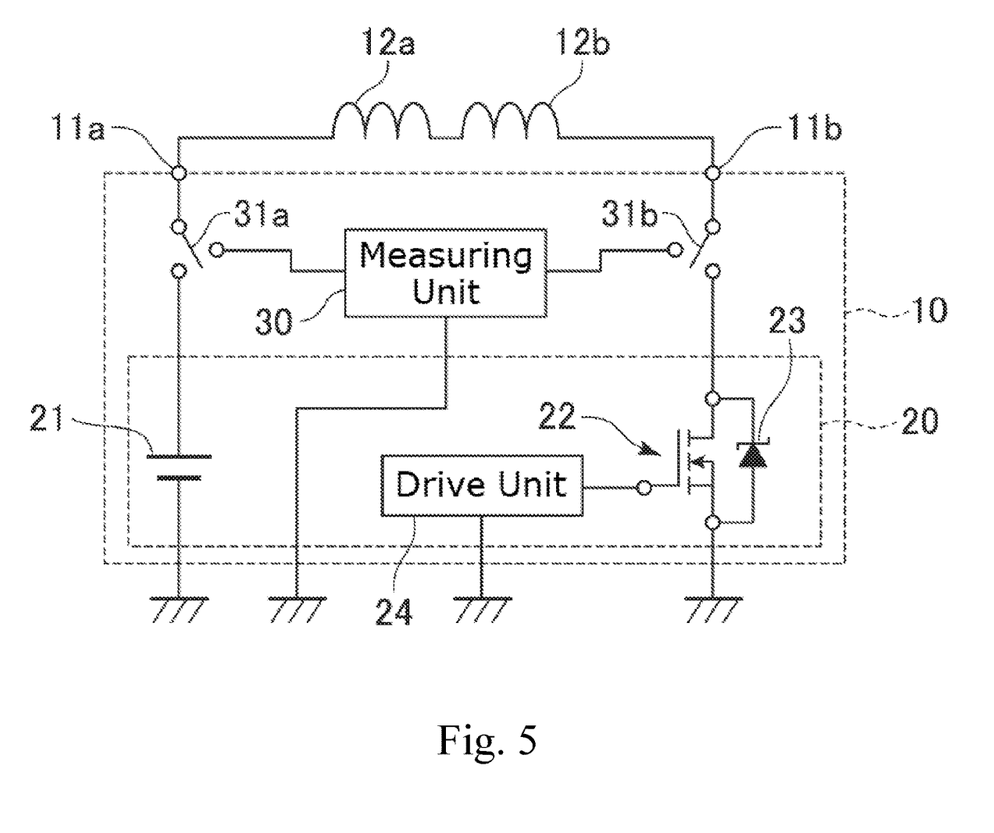
FIG. 5 is a block diagram schematically illustrating functionality of a test device according to another embodiment of the present invention.
Figure 6:
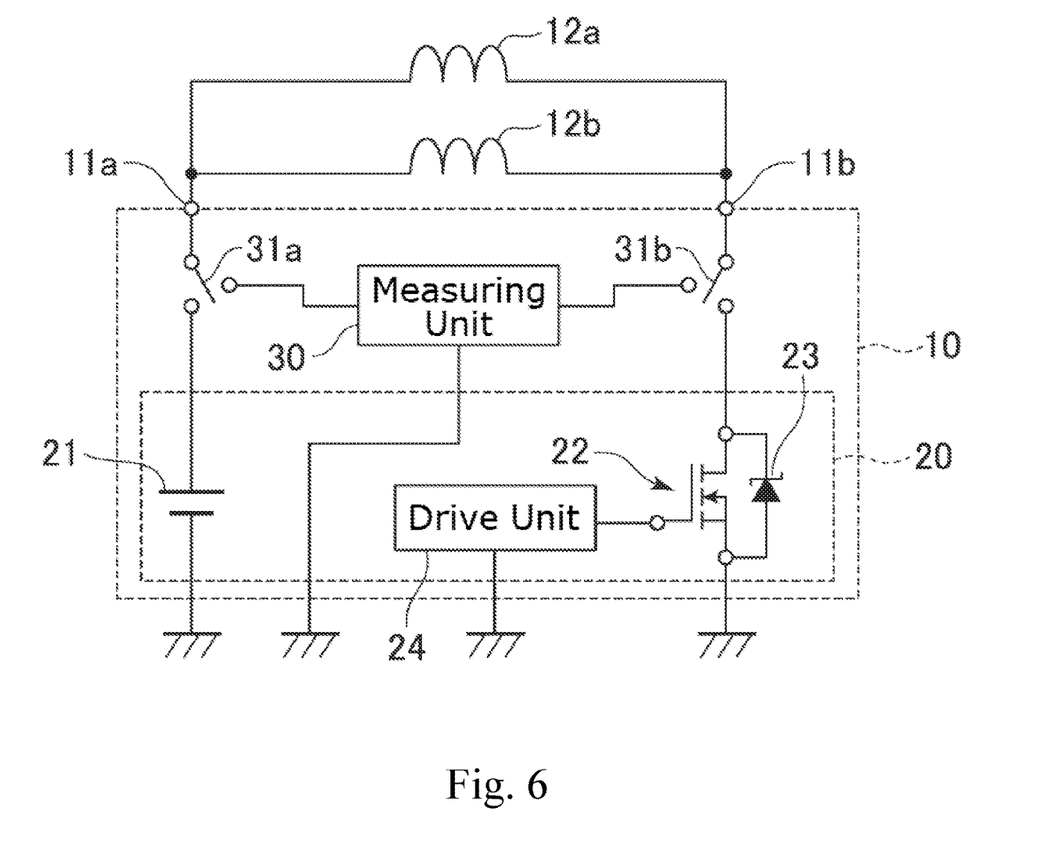
FIG. 6 is a block diagram schematically illustrating functionality of a test device according to another embodiment of the present invention.

FIG. 5 and FIG. 6 show test devices according to still another embodiment of the present invention. As shown in FIG. 5, in an embodiment of the present invention, the test device 10 may be connected to two subject coils that are connected in series between the measurement terminal 11a and the measurement terminal 11b. The test device 10 may be connected to three or more subject coils in series. As shown in FIG. 6, in an embodiment of the present invention, the test device 10 may be connected to two subject coils that are connected in parallel between the measurement terminal 11a and the measurement terminal 11b. The test device 10 may be connected to three or more subject coils in parallel.

Advantageous effects of the embodiments will be now described. In the test device 10 according to the embodiment, the voltage $V_D$ from the direct-current power source 21 causes an electric current to flow through the coil 12 and the MOSFET 22 while the MOSFET 22 is on. When the MOSFET 22 is turned off, the electric current flowing through the coil 12 and between the drain and the source of the MOSFET 22 is immediately shut off, and therefore, a counter electromotive force is generated immediately in the circuit and acts on the coils, the counter electromotive force being larger than the voltage $V_D$ applied by the direct-current power source 21. The MOSFET 22 is repeatedly turned on and off so as to repeatedly apply to the subject coil 12 a surge voltage according to the counter electromotive force larger than the voltage $V_D$ applied by the direct-current power source 21. Thus, through the operation of the voltage applying unit 20, the test device 10 can apply to the subject coil 12 the same voltage stress as in the actual use environment. The characteristic values of the coils 12 having received the voltage stress applied thereto are obtained by measurement of the measuring unit 30, so as to test the long-term reliability of the coil 12.

Besides the method described above, there is another possible method for diagnosing a failure in the life failure mode, which includes amplifying the voltage of the direct-current power source by a high-speed alternating-current amplifier and repeatedly applying the amplified voltage to the subject coil. However, in the case where a voltage is applied to the subject coil by an alternating-current amplifier, an electric current constantly flows through the coil, and therefore, a failure in the current failure mode tends to occur. By contrast, in the above embodiment, when the counter electromotive force $V_{DS}$ is generated, the MOSFET 22 is turned off and the circuit is insulated, and thus no electric current flows through the subject coil 12. Therefore, the subject coil is less prone to a failure in the current failure mode. Thus, the test device 10 makes it possible to diagnose whether there is abnormality in the life failure mode with no failure in the current failure mode occurring in the subject coil 12.

In the above embodiment, the voltage regulator diode 23 limits the voltage applied across the coil 12 when the counter electromotive force is generated. More specifically, the surge voltage applied across the coil 12 has the magnitude of $V_A-V_D$, the difference between the yield voltage $V_A$ of the voltage regulator diode 23 and the voltage $V_D$ of the direct-current power source, instead of the counter electromotive force $V_{DS}$ itself. Thus, it can be prevented that the voltage applied by the test device 10 causes a failure in the over-voltage failure mode to occur in the coil 12. Further, the voltage regulator diode 23 prevents a voltage exceeding the withstanding voltage of the MOSFET 22 from being applied to the MOSFET 22.

In the above embodiment, the test device 10 may be connected to a plurality of coils in series or in parallel. Thus, the reliability test can be conducted on a plurality of coils in parallel. Accordingly, the test device 10 makes it possible to conduct the reliability test of coils efficiently.

The test device 110 and the test device 210 provide the same advantageous effects as the test device 10.

The dimensions, materials, and arrangements of the constituent elements described herein are not limited to those explicitly described for the embodiments, and these constituent elements can be modified to have any dimensions, materials, and arrangements within the scope of the present invention. Furthermore, constituent elements not explicitly described herein can also be added to the embodiments described, and it is also possible to omit some of the constituent elements described for the embodiments.

What is claimed is:

1. A test device comprising:
   a first measurement terminal connected to one end of a first coil to be tested;
   a second measurement terminal connected to another end of the first coil;
   a direct-current power source connected to the first measurement terminal;
   a first semiconductor switch connected between the second measurement terminal and a ground; and
   a drive unit for turning on and off the first semiconductor switch.

2. The test device of claim 1, wherein the first semiconductor switch is an FET switch with a gate connected to the drive unit, a drain connected to the second measurement terminal, and a source connected to the ground.

3. The test device of claim 1, further comprising a voltage limiting element for limiting a counter electromotive force to a first voltage, the counter electromotive force being applied to the first coil when the first semiconductor switch is turned off.

4. The test device of claim 3, wherein the voltage limiting element is a voltage regulator diode.

5. The test device of claim 1, further comprising another direct-current power source connected between the second measurement terminal and the ground.

6. The test device of claim 1, wherein at least a second coil is connected between the first measurement terminal and the second measurement terminal in series with the first coil.

7. The test device of claim 1, wherein at least a second coil is connected between the first measurement terminal and the second measurement terminal in parallel with the first coil.

8. The test device of claim 7, wherein one end of the second coil is connected to the first measurement terminal, and another end of the second coil is connected to a third measurement terminal, and
   wherein the test device further comprises a second semiconductor switch connected between the third measurement terminal and the ground.

9. The test device of claim 1, further comprising a measuring unit for measuring a characteristic value of the first coil.

10. A test method for testing reliability of a first coil connected between a first measurement terminal and a second measurement terminal, the first measurement terminal being connected to a direct-current power source, the method comprising:
 a voltage application step of turning on and off a first semiconductor switch connected between the second measurement terminal and a ground, so as to apply a counter electromotive force to the first coil when the first semiconductor switch is turned off; and
 a measuring step of measuring a characteristic value of the first coil.

11. The test method of claim 10, wherein in the measuring step, the characteristic value of the first coil is measured after the semiconductor switch is turned on and off for a number of times for testing.

12. The test method of claim 10, wherein in the voltage application step, the counter electromotive force is limited to a first voltage, the counter electromotive force being applied to the first coil when the first semiconductor switch is turned off.

13. The test method of claim 10, further comprising a determination step of determining whether there is abnormality in the first coil by comparing the characteristic value measured in the measuring step with a reference characteristic value.

14. The test method of claim 10, further comprising a determination step of determining whether there is abnormality in the first coil by comparing a measurement profile showing a time variation of the characteristic value measured in the measuring step with a reference profile.

15. The test method of claim 10, further comprising a display step of displaying the characteristic value measured in the measuring step.

16. The test method of claim 10, further comprising a step of limiting the counter electromotive force to a first voltage, the counter electromotive force being applied to the first coil when the first semiconductor switch is turned off.

17. The test method of claim 10, further comprising a step of applying a direct current to the first coil by another direct-current power source connected between the second measurement terminal and the ground.

18. The test method of claim 10, wherein in the voltage application step, the counter electromotive force is applied to the first coil and a second coil when the first semiconductor switch is turned off, the second coil being connected between the first measurement terminal and the second measurement terminal in series with the first coil.

19. The test method of claim 10, wherein in the voltage application step, the counter electromotive force is applied to the first coil and a second coil when the first semiconductor switch is turned off, the second coil being connected between the first measurement terminal and the second measurement terminal in parallel with the first coil.

20. The test method of claim 19, wherein one end of the second coil is connected to the first measurement terminal, and another end of the second coil is connected to a third measurement terminal, and
 wherein in the voltage application step, a second semiconductor switch connected between the third measurement terminal and the ground is turned on and off, so as to apply a counter electromotive force to the second coil when the second semiconductor switch is turned off.

* * * * *